(12) United States Patent  
Lee et al.

(10) Patent No.: US 8,816,580 B2  
(45) Date of Patent: Aug. 26, 2014

(54) ORGANIC LIGHT EMITTING DISPLAY

(71) Applicant: Samsung Display Co., Ltd, Yongin-si (KR)

(72) Inventors: An-Su Lee, Yongin-si (KR); Tae-Jin Kim, Yongin-si (KR); Do-Youb Kim, Yongin-si (KR); Sang-Kyun Cho, Yongin-si (KR); Seung-Woo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/666,346

(22) Filed: Nov. 1, 2012

(65) Prior Publication Data  
US 2014/0003045 A1  Jan. 2, 2014

(30) Foreign Application Priority Data  
Jun. 27, 2012  (KR) .......................... 10-2012-0069258

(51) Int. Cl.  
*H01L 51/52* (2006.01)

(52) U.S. Cl.  
USPC ............................................. 313/505; 345/76

(58) Field of Classification Search  
USPC ................................. 313/498–512; 345/76, 690  
See application file for complete search history.

(56) References Cited

U.S. PATENT DOCUMENTS

| | | | |
|---|---|---|---|
| 2009/0102753 | A1 | 4/2009 | Yamashita et al. |
| 2009/0121983 | A1 | 5/2009 | Sung et al. |
| 2011/0260951 | A1 | 10/2011 | Hwang et al. |
| 2012/0133682 | A1 * | 5/2012 | Kawano et al. ............... 345/690 |

FOREIGN PATENT DOCUMENTS

| | | | | |
|---|---|---|---|---|
| EP | 2595192 A2 | 5/2013 | | |
| KR | 10-2005-0031888 A | 4/2005 | | |
| KR | 10-2006-0104484 A | 10/2006 | | |
| KR | 20110108050 | * | 5/2011 | ............. H01L 51/52 |
| KR | 10-2011-0108050 A | 10/2011 | | |

OTHER PUBLICATIONS

EPO Search Report dated Sep. 5, 2013, for corresponding European Patent application 13153912.4, (5 pages).  
European Office action dated Nov. 22, 2013, for corresponding European Patent application 13153912.4 (10 pages).

* cited by examiner

*Primary Examiner* — Donald Raleigh  
(74) *Attorney, Agent, or Firm* — Christie, Parker & Hale, LLP

(57) ABSTRACT

There is provided an organic light emitting display capable of increasing an aperture ratio. The organic light emitting display includes red pixels including red emission regions, green pixels including green emission regions, and blue pixels including blue emission regions. In at least one of the red emission regions, the green emission regions, and the blue emission regions, a distance between an emission region and an adjacent emission region above the emission region is different from a distance between the emission region and another adjacent emission region below the emission region.

13 Claims, 5 Drawing Sheets

B:70ppi    R:209ppi    G:350ppi

220ppi: (440ppi/2)

ORGANIC LIGHT EMITTING DISPLAY

CROSS-REFERENCE TO RELATED APPLICATION

This application claims priority to and the benefit of Korean Patent Application No. 10-2012-0069258, filed on Jun. 27, 2012, in the Korean Intellectual Property Office, the entire content of which is incorporated herein by reference.

BACKGROUND

1. Field

Embodiments of the present invention relate to an organic light emitting display, and more particularly, to an organic light emitting display capable of improving an aperture ratio.

2. Description of the Related Art

Recently, various flat panel displays (FPDs) capable of reducing weight and volume as compared to cathode ray tubes (CRT) have been developed. The FPDs include liquid crystal displays (LCDs), field emission displays (FEDs), plasma display panels (PDPs), and organic light emitting displays.

Among the FPDs, the organic light emitting display displays an image with set or predetermined brightness using pixels formed in a pixel region. For example, the organic light emitting display includes red, green, and blue pixels to display various colored images.

On the other hand, in various fields including a portable display device, panels having high resolution, for example, resolution of no less than 400 ppi, are used. However, since the size of a pixel is reduced when the resolution is increased, the aperture ratio of the pixel is reduced. For example, when the resolution is 410 ppi, the aperture ratio is no more than about 5%.

In more detail, a pixel includes red, green, and blue emission regions, and the emission regions are symmetrically arranged in the pixel. In this case, the emission regions are arranged at uniform intervals in a vertical line. However, when the emission regions are symmetrically arranged in the pixel, the emission regions are formed only in a partial area of a usable area so that the aperture ratio deteriorates.

In more detail, various components including an emission region and a via hole are provided in a pixel. Therefore, when the emission regions are symmetrically formed regardless of the components included in the pixel, the area in which the emission regions are formed is reduced so that the aperture and the degree of freedom of design deteriorate.

SUMMARY

Accordingly, embodiments of the present invention have been made to provide an organic light emitting display capable of improving an aperture ratio.

In one embodiment, there is provided an organic light emitting display, including red pixels including red emission regions, green pixels including green emission regions, and blue pixels including blue emission regions. In at least one of the red emission regions, the green emission regions, or the blue emission regions, a distance between an emission region and an adjacent emission region above the emission region is different from a distance between the emission region and another adjacent emission region below the emission region.

The blue emission regions may include a first blue emission region, a second blue emission region, and a third blue emission region. The first blue emission region may be separated from the second blue emission region positioned above the first blue emission region at a first distance, and may be separated from the third blue emission region positioned below the first blue emission region at a second distance different from the first distance. The blue emission regions positioned in i-th (i is a natural number) horizontal lines may be arranged at upper sides of corresponding ones of the blue pixels. The blue emission regions positioned in (i+1)th horizontal lines may be arranged at lower sides of corresponding ones of the blue pixels.

The red emission regions may include a first red emission region, a second red emission region, and a third red emission region. The first red emission region may be separated from the second red emission region positioned above the first red emission region at a first distance, and may be separated from the third red emission region positioned below the first red emission region at a second distance different from the first distance. The red emission regions positioned in i-th (i is a natural number) horizontal lines may be arranged at upper sides of corresponding ones of the red pixels. The red emission regions positioned in (i+1)th horizontal lines may be arranged at lower sides of corresponding ones of the red pixels. The green emission regions may be arranged at uniform intervals.

The red pixels, the green pixels, and the blue pixels may be arranged in a delta structure where one unit pixel includes one of the red pixels, one of the green pixels, and one of the blue pixels, and the pixels of the unit pixel may be positioned in two horizontal lines. The blue emission regions positioned in i-th (i is a natural number) horizontal lines may be arranged at upper sides of corresponding ones of the blue pixels. The blue emission regions positioned in (i+2)th horizontal lines may be arranged at lower sides of corresponding ones of the blue pixels. The red emission regions positioned in i-th (i is a natural number) horizontal lines may be arranged at upper sides of corresponding ones of the red pixels. The red emission regions positioned in (i+2)th horizontal lines may be arranged at lower sides of corresponding ones of the red pixels.

In another embodiment, an organic light emitting display includes red pixels including red emission regions, green pixels including green emission regions, and blue pixels including blue emission regions. At least one emission region of the red emission regions, the green emission regions, or the blue emission regions is non-symmetrically formed in a corresponding one of the pixels including the emission region.

The blue emission regions may be non-symmetrically formed in the blue pixels. A blue emission region of the blue emission regions positioned in a first horizontal line may be located at an upper side of a corresponding one of the blue pixels. A blue emission region of the blue emission regions positioned in a second horizontal line adjacent to the first horizontal line may be located at a lower side of a corresponding one of the blue pixels.

The red emission regions may be non-symmetrically formed in the red pixels. A red emission region of the red emission regions positioned in a first horizontal line may be located at an upper side of a corresponding one of the red pixels. A red emission region of the red emission regions positioned in a second horizontal line adjacent to the first horizontal line may be located at a lower side of a corresponding one of the red pixels.

The green emission regions may be non-symmetrically formed in the green pixels.

In the organic light emitting display according to embodiments of the present invention, the red emission and/or the blue emission region are non-symmetrically arranged in the pixel. In this case, it is possible to secure the degree of freedom of design and to increase the area in which the emission regions are formed so that it is possible to secure a high aperture ratio.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
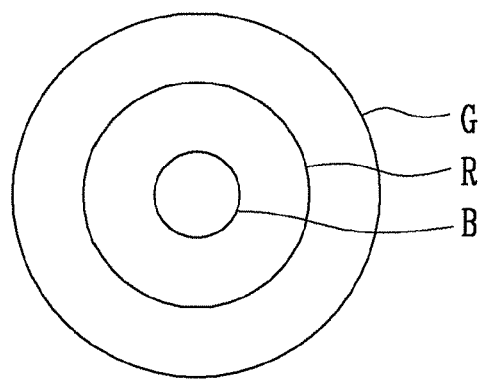
FIG. 1 is a view illustrating a recognition resolution of a pixel.

Hereinafter, certain exemplary embodiments according to the present invention will be described with reference to the accompanying drawings. Here, when a first element is described as being coupled to a second element, the first element may be directly coupled to the second element, or indirectly coupled to the second element via a third element. Further, some of the elements that are not essential to the complete understanding of the invention may be omitted for clarity. Also, like reference numerals refer to like elements throughout.

Hereinafter, an organic light emitting display will be described in detail as follows with reference to FIGS. 1 through 6 in which various embodiments by which those skilled in the art may easily perform the present invention are included.

FIG. 1 is a view illustrating a recognition resolution of a pixel. In FIG. 1, a characteristic in a visual range is 25 cm.

Referring to FIG. 1, experimentally, a green pixel is most sensitive in terms of visibility. When green emission regions G are arranged at uniform intervals in a vertical line, noise in the form of horizontal stripes is generally not recognized at a resolution of no less than 350 ppi. In the case of red pixels, when red emission regions R are arranged at uniform intervals, noise in the form of horizontal stripes is generally not recognized at a resolution of no less than 209 ppi. In the case of blue pixels, when blue emission regions B are arranged at uniform intervals, noise in the form of horizontal stripes is generally not recognized at a resolution of no less than 70 ppi.

Considering the above characteristic, according to the present invention, the emission regions B and R of the blue and/or red pixels are non-symmetrically arranged to improve an aperture ratio. On the other hand, the emission regions G of the green pixels are symmetrically arranged to prevent or reduce noise in the form of stripes from being recognized.

Figure 2:
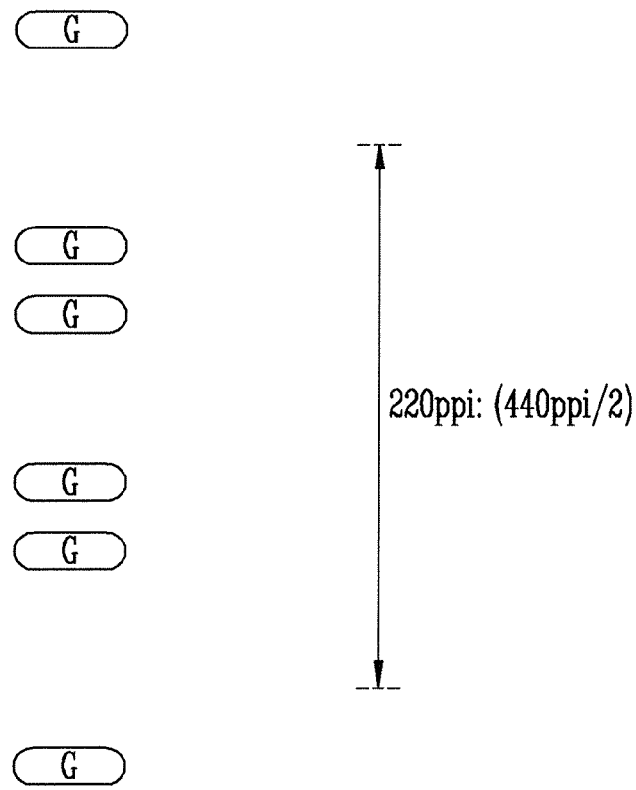
FIG. 2 is a view illustrating an embodiment of non-symmetrical arrangement of a green emission region.

As illustrated in FIG. 2, in a panel having a resolution of 440 ppi, the emission regions G of the green pixels may be non-symmetrically arranged. For example, the green emission regions G may be provided at the lower sides of the pixels in j-th (j is 1, 3, 5, . . . ) horizontal lines and may be arranged at the upper sides of the pixels in (j+1)th horizontal lines. In this case, the green emission regions G positioned at two horizontal lines are symmetrical with the green emission regions G positioned at adjacent two horizontal lines so that resolution is symmetrically set as 220 ppi that is half of 440 ppi. Therefore, when the emission regions G are non-symmetrically arranged in the green pixels at the resolution of 440 ppi, green pixels are recognized as noise in the form of horizontal stripes. That is, it is difficult to symmetrically arrange the green pixels at currently used resolution. Therefore, according to the present invention, the emission regions G of the green pixels are arranged at uniform intervals.

Figure 3:
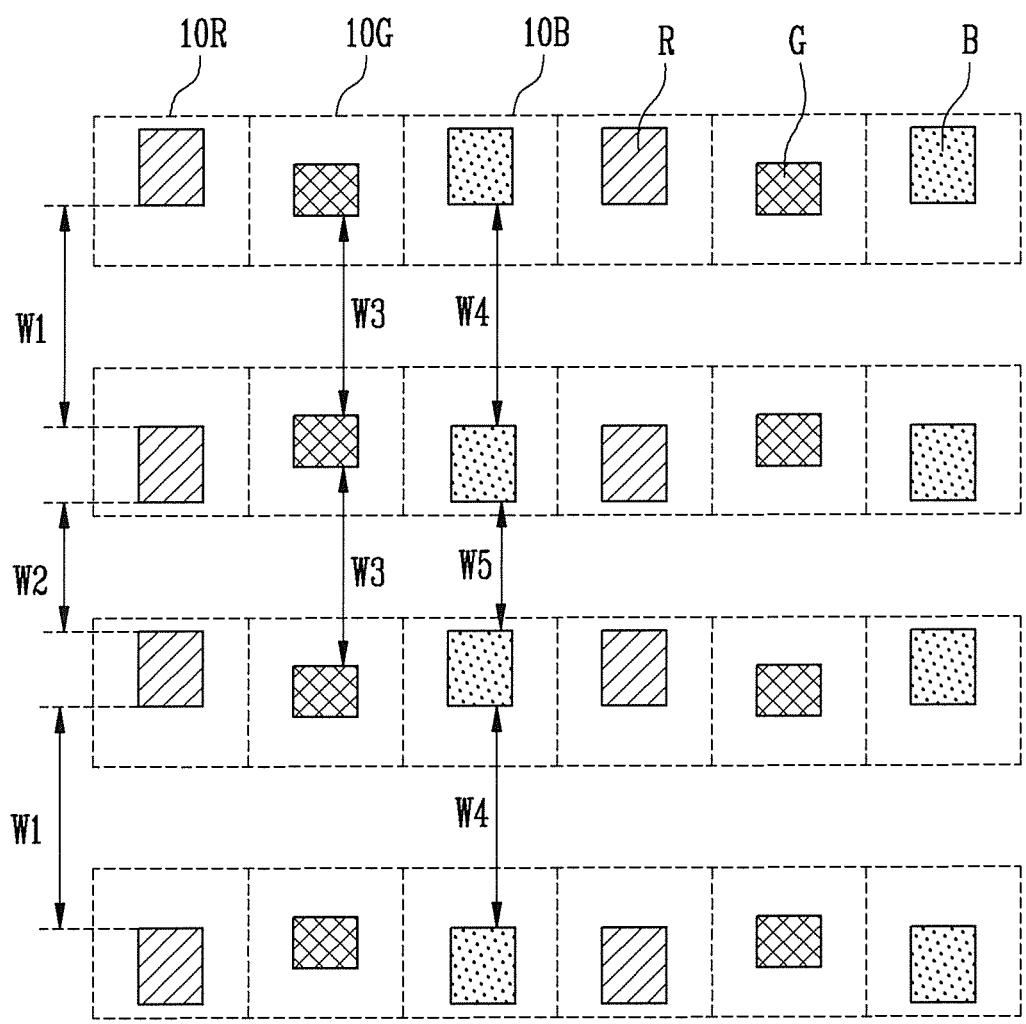
FIG. 3 is a view illustrating a pixel structure of an organic light emitting display according to a first embodiment of the present invention.

FIG. 3 is a view illustrating a pixel structure of an organic light emitting display according to a first embodiment of the present invention.

Referring to FIG. 3, the organic light emitting display according to the first embodiment of the present invention includes red pixels 10R, green pixels 10G, and blue pixels 10B. The red pixels 10R, the green pixels 10G, and the blue pixels 10B are repeatedly arranged in horizontal lines, and the pixels 10R, 10G, and 10B that emit light components of the same color are repeatedly arranged in vertical lines. That is, the organic light emitting display of FIG. 3 has a structure in the form of stripes.

The red pixels 10R include red emission regions R for generating red light. The green pixels 10G include green emission regions G for generating green light. The blue pixels 10B include blue emission regions B for generating blue light. Here, the green emission regions G are arranged at substantially uniform intervals, and the blue emission regions B are arranged at different intervals (e.g., non-uniform intervals). The red emission regions R are arranged at different intervals (e.g., non-uniform intervals).

In more detail, the distance between a red emission region R and an adjacent red emission region R above the red emission region R, is different from the distance between the red emission region R and another adjacent red emission region R below the red emission region R. For example, a specific red emission region R is separated from an adjacent red emission region R above the red emission region R at a first distance W1, and is separated from another adjacent red emission region R below the red emission region R at a second distance W2 different from the first distance W1. Therefore, the red emission regions R positioned in i-th (i is a natural number) horizontal lines are formed at the upper sides of the pixels 10R, and the red emission regions R positioned in (i+1)th horizontal lines are formed at the lower sides of the pixels 10R.

The distance between a blue emission region B and an adjacent blue emission region B above the blue emission region B is different from the distance between the blue emission region B and another adjacent blue emission region B below the blue emission region B. For example, a specific blue emission region B is separated from an adjacent blue emission region B above the blue emission region B at a fourth distance W4 and is separated from another adjacent blue emission region B below the blue emission region B at a fifth distance W5 different from the fourth distance W4. Therefore, the blue emission regions B positioned in the i-th horizontal lines are formed at the upper sides of the pixels 10B, and the blue emission regions B positioned in the $(i+1)^{th}$ horizontal lines are formed at the lower sides of the pixels 10B.

As described above, the red emission regions R and the blue emission regions B are not arranged at uniform intervals in vertical lines. In this case, the degree of freedom of design may be secured in forming the red and blue pixels 10R and 10B. In addition, the space of the pixels 10R and 10B may be maximally used so that the aperture ratio of the pixels 10R and 10B may be increased. In addition, the first distance W1, the second distance W2, the fourth distance W4, and the fifth distance W5 may be variously set in consideration of the resolution and size of the panel. For example, the first distance W1 and the fourth distance W4 may be set to be the same, and the second distance W2 and the fifth distance W5 may be set to be the same.

A green emission region G is separated from an adjacent green emission region G above the green emission region G, and is separated from another adjacent green emission region G below the green emission region G at a third distance W3. When the green emission regions G are formed at uniform intervals, it is possible to prevent or reduce noise in the form of horizontal stripes from being generated. In addition, in general, since the green emission regions G have high emission efficiency relative to the red and blue emission regions, although the aperture ratio is small, a high quality image may be displayed.

On the other hand, in FIG. 3, the red emission regions R and the blue emission regions B are non-symmetrically formed. However, the present invention is not limited to the above. For example, as illustrated in FIG. 4, at a resolution of no more than 420 ppi, the red emission regions G may be arranged at uniform intervals to prevent or reduce noise in the form of stripes from being generated.

Figure 4:
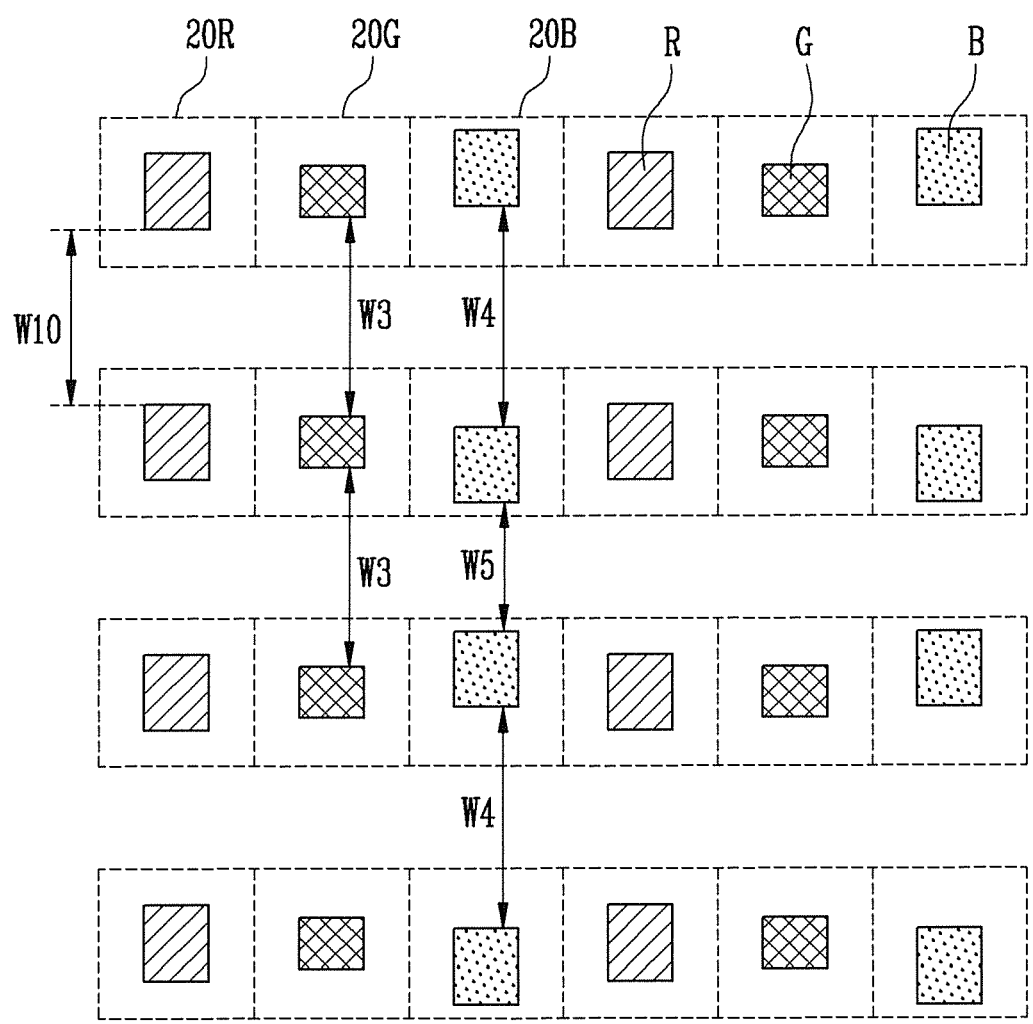
FIG. 4 is a view illustrating a pixel structure of an organic light emitting display according to a second embodiment of the present invention.

FIG. 4 is a view illustrating a pixel structure of an organic light emitting display according to a second embodiment of the present invention.

Referring to FIG. 4, the organic light emitting display according to the second embodiment includes red pixels 20R, green pixels 20G, and blue pixels 20B. The organic light emitting display of FIG. 4 according to the present invention has a structure in the form of stripes.

The red pixels 20R include red emission regions R for generating red light. The green pixels 20G include green emission regions G for generating green light. The blue pixels 20B include blue emission regions B for generating blue light.

Here, a specific red emission region R is separated from an adjacent red emission region R above the red emission region R, and is separated from another adjacent red emission region R below the red emission region R at the tenth distance W10. A specific green emission region G is separated from an adjacent green emission region G above the green emission region G, and is separated from another adjacent green emission region G below the green emission region G at the third distance W3.

In more detail, the distance between a blue emission region B and an adjacent blue emission region B above the blue emission region B is different from the distance between the blue emission region B and another adjacent blue emission region B below the blue emission region B. For example, a specific blue emission region B is separated from an adjacent blue emission region B above the blue emission region B at the fourth distance W4, and is separated from another adjacent blue emission region B below the blue emission region B at the fifth distance W5 different from the fourth distance W4. Therefore, the blue emission regions B positioned in i-th (i is a natural number) horizontal lines are formed at the upper sides of the pixels 20B, and the blue emission regions B positioned in (i+1)th horizontal lines are formed at the lower sides of the pixels 20B.

When the blue emission regions B are not arranged at uniform intervals, it is possible to secure the degree of freedom of design and to increase the aperture ratio.

Figure 5:
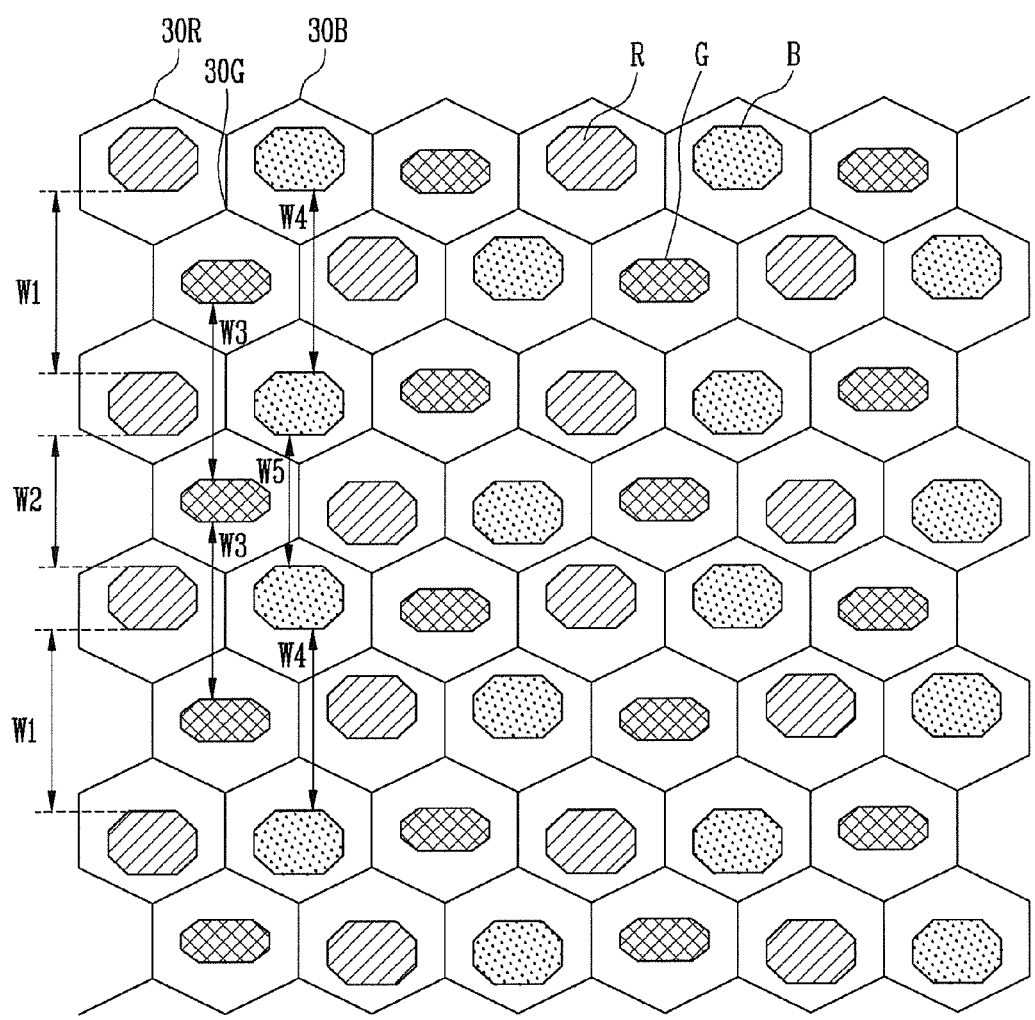
FIG. 5 is a view illustrating a pixel structure of an organic light emitting display according to a third embodiment of the present invention.

FIG. 5 is a view illustrating a pixel structure of an organic light emitting display according to a third embodiment of the present invention.

Referring to FIG. 5, the organic light emitting display according to the third embodiment of the present invention has a delta structure (e.g., a hexagon structure) in which pixels 30R, 30G, and 30B of one unit pixel are positioned in two horizontal lines.

The red pixels 30R include red emission regions R for generating red light. The green pixels 30G include green emission regions G for generating green light. The blue pixels 30B include blue emission regions B for generating blue light. Here, the green emission regions G are arranged at uniform intervals, and the blue emission regions B are arranged at different intervals. The red emission regions R are arranged at different intervals.

In more detail, the distance between a red emission region R and an adjacent red emission region R above the red emission region R is different from the distance between the red emission region R and another adjacent red emission region R below the red emission region R. For example, a specific red emission region R is separated from an adjacent red emission region R above the red emission region R at the first distance W1, and is separated from another adjacent red emission region R below the red emission region R at the second distance W2 different from the first distance W1. Therefore, the red emission regions R positioned in the i-th (i is a natural number) horizontal lines are formed at the upper sides of the pixels 30R, and the red emission regions R positioned in (i+2)th horizontal lines are formed at the lower sides of the pixels 30R.

The distance between a blue emission region B and an adjacent blue emission region B above the blue emission region B is different from the distance between the blue emission region B and another adjacent blue emission region B below the blue emission region B. For example, a specific blue emission region B is separated from an adjacent blue emission region B above the blue emission region B at the fourth distance W4, and is separated from another adjacent blue emission region B below the blue emission region B at the fifth distance W5 different from the fourth distance W4. Therefore, the blue emission regions B positioned in the i-th horizontal lines are formed at the upper sides of the pixels 30B, and the blue emission regions B positioned in the (i+2)th horizontal lines are formed at the lower sides of the pixels 30B.

As described above, the red emission regions R and the blue emission regions B are not arranged at uniform intervals in vertical lines. In this case, the degree of freedom of design may be secured in forming the pixels 30R and 30B. In addition, the space of the pixels 30R and 30B may be maximally used so that the aperture ratio of the pixels 30R and 30B may be increased. In addition, the first distance W1, the second distance W2, the fourth distance W4, and the fifth distance W5 may be variously set in consideration of the resolution and size of the panel. For example, the first distance W1 and the fourth distance W4 may be set to be the same, and the second distance W2 and the fifth distance W5 may be set to be the same.

A green emission region G is separated from an adjacent green emission region G above the green emission region G, and is separated from another adjacent green emission region G below the green emission region G at the third distance W3. When the green emission regions G are formed at uniform intervals, it is possible to prevent or reduce noise in the form of horizontal stripes from being generated. In addition, in general, since the green emission regions G have high emission efficiency relative to the red and blue emission regions, although the aperture ratio is small, a high quality image may be displayed.

On the other hand, in FIG. 5, the red emission regions R and the blue emission regions B are non-symmetrically formed. However, the present invention is not limited to the above. For example, as illustrated in FIG. 6, at a resolution of no more than 420 ppi, the red emission regions G may be arranged at uniform intervals to prevent or reduce noise in the form of stripes from being generated.

Figure 6:
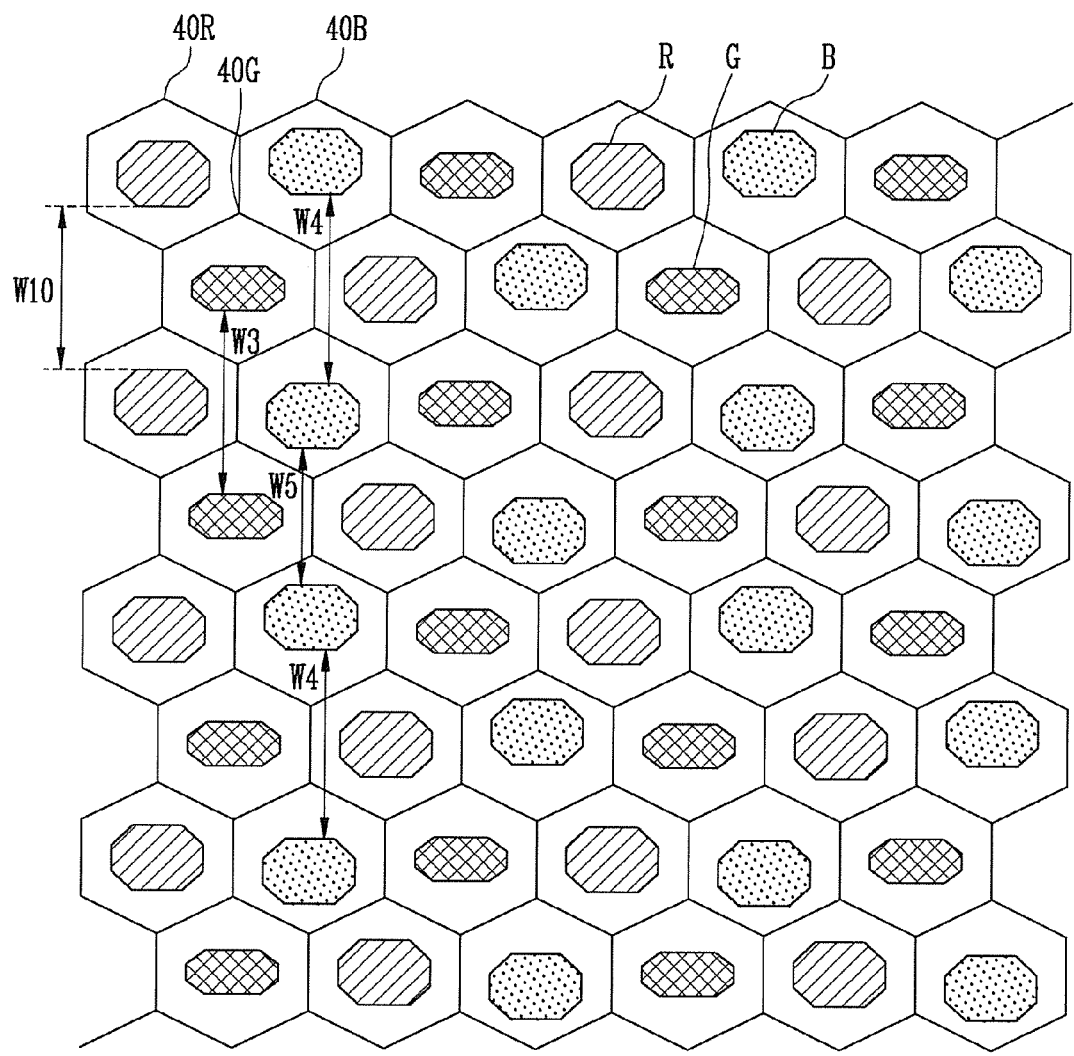
FIG. 6 is a view illustrating a pixel structure of an organic light emitting display according to a fourth embodiment of the present invention.

FIG. 6 is a view illustrating a pixel structure of an organic light emitting display according to a fourth embodiment of the present invention.

Referring to FIG. 6, the organic light emitting display according to the fourth embodiment includes red pixels 40R, green pixels 40G, and blue pixels 40B. The organic light emitting display according to the present invention has a delta structure.

The red pixels 40R include red emission regions R for generating red light. The green pixels 40G include green emission regions G for generating green light. The blue pixels 40B include blue emission regions B for generating blue light.

Here, a specific red emission region R is separated from an adjacent red emission region R above the red emission region R, and is separated from another adjacent red emission region R below the red emission region R at the tenth distance W10. A specific green emission region G is separated from an adjacent green emission region G above the green emission region G, and is separated from another adjacent green emission region G below the green emission region G at the third distance W3.

In more detail, the distance between a blue emission region B and an adjacent blue emission region B above the blue emission region B is different from the distance between the blue emission region B and another adjacent blue emission region B below the blue emission region B. For example, a specific blue emission region B is separated from an adjacent blue emission region B above the blue emission region B at the fourth distance W4, and is separated from another adjacent blue emission region B below the blue emission region B at the fifth distance W5 different from the fourth distance W4. Therefore, the blue emission regions B positioned in the i-th (i is a natural number) horizontal lines are formed at the upper sides of the pixels 40B, and the blue emission regions B positioned in the (i+2)th horizontal lines are formed at the lower sides of the pixels 40B.

When the blue emission regions B are not arranged at uniform intervals, it is possible to secure the degree of freedom of design and to increase the aperture ratio.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   red pixels comprising red emission regions arranged in a first vertical line containing only red pixels;
   green pixels comprising green emission regions arranged in a second vertical line containing only green pixels and different from the first vertical line; and
   blue pixels comprising blue emission regions arranged in a third vertical line containing only blue pixels and different from the first and second vertical lines,
   wherein, for at least one of the red emission regions or the blue emission regions, a distance between an emission region and an adjacent emission region above the emission region is different from a distance between the emission region and another adjacent emission region below the emission region, and
   wherein the green emission regions are arranged at uniform intervals.

2. The organic light emitting display as claimed in claim 1, wherein the blue emission regions comprise a first blue emission region, a second blue emission region, and a third blue emission region, and
   wherein the first blue emission region is separated from the second blue emission region positioned above the first blue emission region at a first distance, and is separated from the third blue emission region positioned below the first blue emission region at a second distance different from the first distance.

3. The organic light emitting display as claimed in claim 2, wherein the blue emission regions positioned in i-th (i is a natural number) horizontal lines are arranged at upper sides of corresponding ones of the blue pixels, and
   wherein the blue emission regions positioned in (i+1)th horizontal lines are arranged at lower sides of corresponding ones of the blue pixels.

4. The organic light emitting display as claimed in claim 1, wherein the red emission regions comprise a first red emission region, a second red emission region, and a third red emission region, and
   wherein the first red emission region is separated from the second red emission region positioned above the first red emission region at a first distance, and is separated from the third red emission region positioned below the first red emission region at a second distance different from the first distance.

5. The organic light emitting display as claimed in claim 4, wherein the red emission regions positioned in i-th (i is a natural number) horizontal lines are arranged at upper sides of corresponding ones of the red pixels, and
   wherein the red emission regions positioned in (i+1)th horizontal lines are arranged at lower sides of corresponding ones of the red pixels.

6. The organic light emitting display as claimed in claim 1, wherein the red pixels, the green pixels, and the blue pixels are arranged in a delta structure where one unit pixel comprises one of the red pixels, one of the green pixels, and one of the blue pixels, and the pixels of the unit pixel are positioned in two horizontal lines.

7. The organic light emitting display as claimed in claim 6, wherein the blue emission regions positioned in i-th (i is a natural number) horizontal lines are arranged at upper sides of corresponding ones of the blue pixels, and
   wherein the blue emission regions positioned in (i+2)th horizontal lines are arranged at lower sides of corresponding ones of the blue pixels.

8. The organic light emitting display as claimed in claim 7, wherein the red emission regions positioned in i-th (i is a natural number) horizontal lines are arranged at upper sides of corresponding ones of the red pixels, and
   wherein the red emission regions positioned in (i+2)th horizontal lines are arranged at lower sides of corresponding ones of the red pixels.

9. An organic light emitting display comprising:
red pixels comprising red emission regions arranged in a first vertical line containing only red pixels;
green pixels comprising green emission regions arranged in a second vertical line containing only green pixels and different from the first vertical line; and
blue pixels comprising blue emission regions arranged in a third vertical line containing only blue pixels and different from the first and second vertical lines,
wherein at least one emission region of the red emission regions or the blue emission regions is non-symmetrically formed in a corresponding one of the pixels including the emission region, and
wherein the green emission regions are arranged at uniform intervals.

10. The organic light emitting display as claimed in claim 9, wherein the blue emission regions are non-symmetrically formed in the blue pixels.

11. The organic light emitting display as claimed in claim 10,
wherein a blue emission region of the blue emission regions positioned in a first horizontal line is located at an upper side of a corresponding one of the blue pixels, and
wherein a blue emission region of the blue emission regions positioned in a second horizontal line adjacent to the first horizontal line is located at a lower side of a corresponding one of the blue pixels.

12. The organic light emitting display as claimed in claim 9, wherein the red emission regions are non-symmetrically formed in the red pixels.

13. The organic light emitting display as claimed in claim 12,
wherein a red emission region of the red emission regions positioned in a first horizontal line is located at an upper side of a corresponding one of the red pixels, and
wherein a red emission region of the red emission regions positioned in a second horizontal line adjacent to the first horizontal line is located at a lower side of a corresponding one of the red pixels.

* * * * *